United States Patent [19]
Zook

[11] Patent Number: 5,467,297
[45] Date of Patent: Nov. 14, 1995

[54] FINITE FIELD INVERSION

[75] Inventor: Christopher P. Zook, Longmont, Colo.

[73] Assignee: Cirrus Logic, Inc., Fremont, Calif.

[21] Appl. No.: 325,831

[22] Filed: Oct. 18, 1994

Related U.S. Application Data

[63] Continuation of Ser. No. 147,758, Nov. 4, 1993.

[51] Int. Cl.$^6$ .............................. G06F 7/00; G06F 15/00; G06F 7/52
[52] U.S. Cl. ........................................ 364/746.1; 364/761
[58] Field of Search ................................. 364/746.1, 761, 364/765, 754; 371/37.1, 37.7

[56] References Cited

U.S. PATENT DOCUMENTS 4,994,995   2/1991   Anderson et al. .................... 364/746.1

*Primary Examiner*—Roy N. Envall, Jr.
*Assistant Examiner*—E. Moise
*Attorney, Agent, or Firm*—Nixon & Vanderhye

[57] ABSTRACT

An inversion circuit (212) determines an inverse $B^{-1}$ of an m-bit symbol B, the symbol B being expressed in a dual basis representation. Inversion circuit (212) includes an iterative convolution circuit (124A, 124B, 124C) to which the symbol B is applied and which generates and stores electrical signals corresponding to an m-bit value A. The value A is in a first basis representation and is generated by the convolution circuit such that an inner product of A and $\alpha^k B$ is equal to 0 for k<m−1. A feedback circuit (128) is provided for enabling the convolution circuit to perform a convolution with an $\alpha$ multiple of B. A multiplier circuit (102) is connected to the convolution circuit and generates electrical output signals corresponding to the product of the value A and $\alpha^{-1}$. The electrical output signals from the multiplier represent $A\alpha^{-1}=B^{-1}$ (i.e., the inverse of the m-bit symbol B in the first basis representation). When necessary, the m-bit value A is bit-positionally justified, either by operating the convolution circuit as a shift register or by loading the value A into a shift register (132).

39 Claims, 5 Drawing Sheets

FINITE FIELD INVERSION

CROSS-REFERENCE TO RELATED APPLICATIONS

This patent application is a continuation application of U.S. Pat. application Ser. No. 08/147,758, filed Nov. 4, 1993, which is incorporated herein by reference.

Patent applications filed concurrently (inventor: Christopher P. Zook) with this patent application and incorporated herein by reference include U.S. patent application Ser. No. 08/325,717 entitled "CYCLIC REDUNDANCY CHECK METHOD AND APPARATUS"; U.S. patent application Ser. No. 08/325,850 entitled "BURST ERROR CORRECTOR", U.S. patent application Ser. No. 08/326,164 entitled "REED SOLOMON DECODER", and U.S. patent application Ser. No. 08/326,126 entitled "ERROR CORRECTION METHOD AND APPARATUS". Patent applications filed concurrently with U.S. patent application Ser. No. 08/147, 758, filed Nov. 4, 1993 (and all hereby incorporated herein by reference) include U.S. patent application Ser. No. 08/147,865 entitled "DUAL PURPOSE CYCLIC REDUNDANCY CHECK", U.S. patent application Ser. No. 08/148, 068 entitled "BURST ERROR CORRECTOR", and U.S. patent application Ser. No. 08/147,650, entitled "REED SOLOMON DETECTOR".

BACKGROUND

1. Field of Invention

This invention relates generally to digital data communication systems, particularly to the arithmetic of finite fields. More particularly, the invention relates to the decoding of error correcting codes.

2. Related Art and Other Considerations

In a digital data communication system (including storage and retrieval from optical or magnetic media) it is necessary to employ an error control system in order to increase the transfer rate of information and at the same time make the error rate arbitrarily low. For fixed signal-to-noise ratios and fixed bandwidths, improvements can be made through the use of error-correcting codes.

With error-correction coding the data to be transmitted or stored is mathematically processed to obtain additional data symbols called check symbols or redundancy symbols. After transmission or retrieval, the received data and check symbols are mathematically processed to obtain information about locations and values of errors. Since it is most efficient to treat the data symbols as members of a finite field rather than the familiar fields of real or rational numbers, finite field arithmetic is used.

One, problem arising in finite field arithmetic is the complexity of performing division as compared to the complexity of performing addition, subtraction or multiplication. Division can-be done by taking the multiplicative inverse .of an element followed by a multiplication. A simple method of inversion would result in a simple method for division.

There are several methods of performing inversion in $GF(2^m)$. The most common is the use of a look-up table, equivalent to a $2^m$ by m ROM. This method is the fastest and requires the most circuit gates. In many applications it is desirable to process m-bit symbols serially to reduce circuit size. In such applications it would be desirable to perform additions, multiplications and inversions of m-bit symbols in m clock cycles. Several such methods acre described.

FIG. 1 shows a circuit which employs the following method: If a is an element of $GF(2^m)$ then $$a^{-1} = a^{2^m-2} = \prod_{n=1}^{m-1} a^{2^n}$$

The inverse can be obtained by repeated squaring and multiplying. However the squaring and multiplication functions must be performed in one clock cycle which causes excessive circuit size. In FIG. 1, R1 is initialized to "a" and clocked once to obtain $a^2$, at which point R2 is initialized to 1. After m−1 more clocks R2, contains $a^{-1}$.

Another method uses the Euclidean algorithm and is described in Berlekamp's Algebraic Coding Theory", published by Aegean Park Press, revised 1984 edition, pp. 36–44. It uses 3m+4 flip-flops and requires 2m+2 clock cycles.

Yet another method, shown in FIG. 2, is described in Whiting's PhD dissertation for the California Institute of Technology entitled "Bit-Serial Reed-Solomon Decoders in VLSI," 1984, p. 58. In the Whiting technique, R is initialized to the element "a" expressed in its dual basis representation (see p. 39 of Whiting) and f(x) is a logic function which produces bit 0 of the dual basis representation for $a^{-1}$. Repeated multiplication of a by $\alpha^{-1}$ allows f(x) to produce the remaining bits of $a^{-1}$. The function f(x) can be implemented by a $2^m$ by 1 ROM. The inverse is produced serially in m clocks.

However, these techniques have the limitation that they require either excessive circuitry or excessive clock cycles to produce an inverse. Thus there is a need for an approach that reduces the size and time requirements for finite field inversion.

SUMMARY

An inversion circuit of the invention determines an inverse $B^{-1}$ of an m-bit finite field symbol B, the symbol B being expressed in a dual basis representation. The inversion circuit includes an iterative convolution circuit to which the symbol B is applied and which generates and stores electrical signals corresponding to an m-bit value A. The value A is in a first basis representation and is generated by the convolution circuit such that an inner product of A and $\alpha^k B$ is equal to 0 for k<m−1. A feedback circuit is provided for enabling the convolution circuit to perform a convolution with an $\alpha$ multiple of B. A multiplier circuit is connected to the convolution circuit and generates electrical output signals corresponding to the product of the value A and $\alpha^{-t}$. The electrical output signals from the multiplier represent $A\alpha^{-t} = B^{-1}$ (i.e., the inverse of the m-bit symbol B in the first basis representation). When necessary, the m-bit value A is bit-positionally justified, either by operating the convolution circuit as a shift register or by loading the value A into a shift register.

In operation, the inversion circuit is first initialized, after which the bits $B_k$ of m-bit symbol B are clocked into "B" registers. During a specific number of clock cycles, i inversion circuit performs a convolution operation similar to that of a conventional binary-oriented Berlekamp-Massey circuit (e.g., determining a current discrepancy $d_n$ and updating values in "A" registers and intermediates registers). The m-bit value A will ultimately be stored in the A registers. The m-bit value of A is developed under the constraint that the inner product of A (in first basis representation) and $\alpha^k B$ (in second basis representation) is 0 for k<m−1.

Generation of A occurs by the convoluted iteration using a sequence $\{S_n\}$. For the m-bit symbol B, the first m members of sequence $\{S_n\}$ (e.g., $S_O$ through $S_{m-1}$) are the first m bits of B (e.g., $B_0$ through $B_{m-1}$). Thus, for the first m clock cycles, the values $B_0$ through $B_{m-1}$ are serially clocked into the B registers. The remainder of the sequence $\{S_n\}$ is generated using the feedback circuit, which generates a feedback $\alpha$ multiple of B. Generating the remainder of sequence $\{S_n\}$ in this manner is understood from a definition of sequence $\{S_n\}$, particularly the expression $S_{j+k}=(\alpha^k B)_j$.

Generation of the sequence $\{S_n\}$, and consequentially of the A values in the "A" registers, continues until either (1) 2m−2 clock cycles are executed, or (2) a length greater than m−1 is attained (provided that $d_n \neq 0$). If a length of greater than m−1 is attained prior to 2m−2 clock cycles, values in the "A" registers are shifted rightwardly (one flip flop per clock cycle;) until cycle 2m−2 is reached. This shifting brings in leading zeros in the left "A" registers, thereby essentially right justifying thee A value in the "A" registers.

In one embodiment, justification of the A value in the "A" registers is accomplished by operating the "A" registers as a shift register. Each "A" register has an associated multiplexer, with the multiplexer for the lower order "A" registers being operative to select between a convolution input and a register-shift input. At a predetermined clock cycle in a convolution performed by the convolution circuit, multiplexers are operative to switch input to the lower order "A" registers from a convolution input to a register-shift input. The predetermined clock cycle occurs when a length of the polynomial exceeds m−1 and a current discrepancy value $d_n$ is non-zero. In another embodiment, the means for justifying the m-bit value A is a shift register connected to the "A" registers.

Advantageously, the inversion circuit of the present invention avoids usage of ROMs and facilitates predominately serial rather than parallel data transfer.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

DETAILED DESCRIPTION OF THE DRAWINGS

Figure 1:
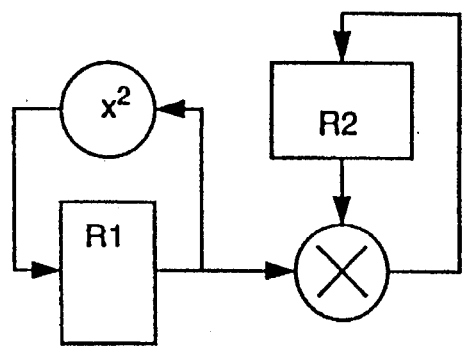
FIG. 1 is a schematic block diagram of a prior art method.
Figure 2:
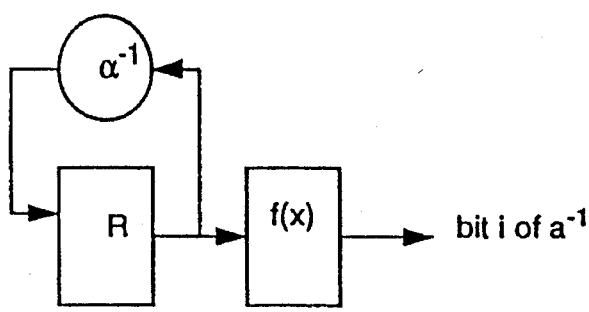
FIG. 2 is a schematic block diagram of another prior art method.

In GF($p^m$) each element may be viewed as a vector in an m-dimensional vector space. The canonical basis set is $\{\alpha^k\}$ for k=0,1, . . . , m−1. Let $\{\alpha^k\}$ be a set of basis vectors such that $\alpha_k = \alpha_O \alpha^k$ for k=0,1, . . . ,m−1. The so-called dual basis to this set is $\{\beta_k\}$ where $\beta_k$ is chosen such that $tr(\alpha_k \beta_j)=\alpha^O$ if k is equal to j and $tr(\alpha_k \beta_j)=0$ if k is not equal to j. The trace function tr(x) is defined $$tr(x) = \sum_{i=0}^{m-1} x^{p^i}$$

Let A be an element of GF($p^m$) expressed in the canonical representation which will be referred to as the representation and let B be an element of GF($p^m$) expressed in the dual basis representation which will be referred to as the $\beta$ representation, i.e.

$$A = \sum_{k=0}^{m-1} A_k \alpha^k$$

and $$B = \sum_{k=0}^{m-1} B_k \beta^k$$

where $A_k$ are the components of the vector A and $B_k$ are the components of vector B. Then $$tr(\alpha_0 \alpha^k B) = tr\left( \alpha_k \sum_{j=0}^{m-1} B_k \beta_j \right) = tr\left( \sum_{j=0}^{m-1} B_j \alpha_k \beta_j \right) \quad \text{EQN. 1}$$

$$= B_k \alpha^0, k = 0, 1, \ldots, m-1$$

Let C be the $\beta$ representation of AB and let $(\alpha^k B)j$ be the components of $\alpha^k B$ in $\beta$ representation. Then from EQN. 1

$$C_k \alpha^0 = tr(\alpha_0 \alpha^k AB), k = 0, 1 \ldots, m-1 \quad \text{EQN. 2}$$

$$= tr\left( \alpha_0 \alpha^k \sum_{j=0}^{m-1} A_j \alpha^j B \right), k = 0, 1, \ldots, m-1$$

$$= tr\left( \sum_{j=0}^{m-1} A_j \alpha_j (\alpha^k B) \right), k = 0, 1, \ldots, m-1$$

$$= tr\left( \sum_{j=0}^{m-1} A_j \alpha_j \left( \sum_{i=0}^{m-1} (\alpha^k B)_i \beta_i \right) \right), k = 0, 1, \ldots, m-1$$

$$= \sum_{j=0}^{m-1} A_j (\alpha^k B)_j \alpha^0, k = 0, 1, \ldots, m-1$$

$$C_k = \sum_{j=0}^{m-1} A_j (\alpha^k B)_j, k = 0, 1, \ldots, m-1$$

i.e. the kth component of the $\beta$ representation of the product of A and B is the inner product of the representation of A and the $\beta$ representation of
Then, from EQN. 1

$$(\alpha^k B)_j \alpha^O = tr(\alpha_O \alpha^j (\alpha^k B)), j=0,1, \ldots, m-1 = tr(\alpha_O \alpha^{j+k} B), j=0,1, \ldots, m-1 \quad \text{EQN.3}$$

EQN 3 implies that if j+k=c+d then $(\alpha^k B)=(\alpha^d B)_c$ and this implies $$(\alpha B)_j = B_{j+1}, j=0,1,\ldots,m-2 \quad \text{EQN.4}$$

EQN. 3 also implies $$(\alpha B)_{m-1}\alpha^0 = tr(\alpha_0 \alpha^m B)$$

Let $G(x)\Sigma\ g_i x^i$ be the $GF(p^m)$ field generator Without loss of generality it can be assumed that $g_m=1$ (if not then $g(x)$ can be divided by $g_m$ to yield a generator with leading coefficient equal to 1). By definition $G(\alpha)=0$, i.e.

$$\sum_{i=0}^{m} g_i \alpha^i = 0 \to \alpha^m = -\sum_{i=0}^{m-1} g_i \alpha^i$$

Therefore $$\begin{aligned}
(\alpha B)_{m-1}\alpha^0 &= -tr\left(\alpha_0 \sum_{i=0}^{m-1} g_i \alpha^i B\right) \quad \text{EQN. 5}\\
&= -\sum_{i=0}^{m-1} g_i tr(\alpha_0 \alpha^i B)\\
&= -\sum_{i=0}^{m-1} g_i B_i \alpha^0
\end{aligned}$$

$$(\alpha B)_{m-1} = -\sum_{i=0}^{m-1} g_i B_i$$

Figure 3:
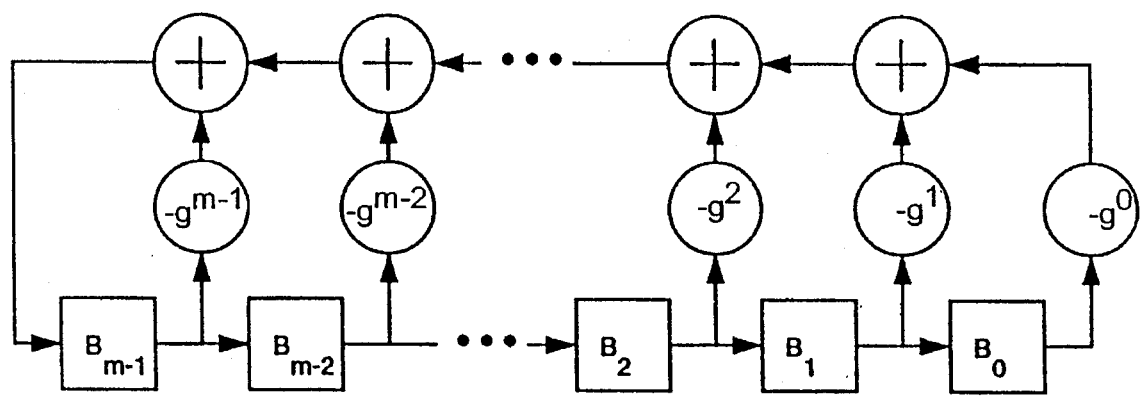
FIG. 3 is a schematic view of a circuit for multiplying by $\alpha$ in $\beta$ representation.

EQN.4 and EQN.5 show that in $\beta$ representation multiplication by $\alpha$ corresponds to a shift with feedback as is illustrated in FIG. 3. From EQN. 3

$$\begin{aligned}
(\alpha^k B)_j &= (\alpha^{j+k-m+1} B)_{m-1}\\
&= (\alpha(\alpha^{j+k-m} B))_{m-1}
\end{aligned}$$

This and EQN.5 implies $$(\alpha^k B)_j = -\sum_{i=0}^{m-1} g_i (\alpha^{j+k-m} B)_i \quad \text{EQN. 6}$$

Now let $\{S_n\}$ be a sequence defined in the following way: $S_{j+k}=(\alpha^k B)_3$. Note that $k=0$ implies $S_n=B_n$ for $n=0,1,\ldots,m-1$. Then, from EQN.6

$$S_{j+k} = -\sum_{i=0}^{m-1} g_i S_{j+k-m+i} \quad \text{for } j+k > m-1$$

or $$S_n = -\sum_{i=0}^{m-1} g_i S_{n-m+i} \quad \text{for } n > m-1$$

Substituting $S_{j+k}$ for $(\alpha^k B)$ in EQN. 2 yields $$C_k = \sum_{j=0}^{m-1} A_j S_{j+k}, k=0,1,\ldots,m-1 \quad \text{EQNS. 7}$$

Now, let $C_k=0$ for $k<m-1$ and $C_{m-1}=1$, i.e. $C=\beta_{m-1}$. $C=\alpha^t$ for some t. With this choice for C the first m−1 equations of EQNS. 7 forms a recurrence relation:

$$A_{m-1}S_{m-1+k} = -\sum_{j=0}^{m-2} A_j S_{j+k}, k=0,1,\ldots,m-2 \quad \text{EQNS. 8}$$

$$S_{m-1+k} = -\sum_{j=0}^{m-2} \frac{A_j}{A_{m-1}} S_{j+k}, k=0,1,\ldots,m-2$$

The Berlekamp-Massey algorithm can be used to generate a linear feedback shift register (LFSR) that will satisfy EQNS. 8. Note that to generate $S_{2m-2}$ requires an LFSR of length m and in fact the taps of it are $g_i$. However EQNS. 8 show that an LFSR of length no greater than m−1 can be lo used to generate $S_k$ for k<2m−2. The vector A generated by the algorithm has the property that $AB=C=\alpha^t$. Therefore $B^{-1}=A\alpha^{-t}$. The number t can be chosen arbitrarily by the proper choice of $\alpha_0$ which also determines the linear transformation from one basis representation to the other. $\alpha_0$ would normally be chosen to minimize the logic needed for the transformations and for multiplying by $\alpha^{-t}$. If the transformations are not a consideration for a particular application then t can be made to be 0.

STRUCTURE

Figure 4:
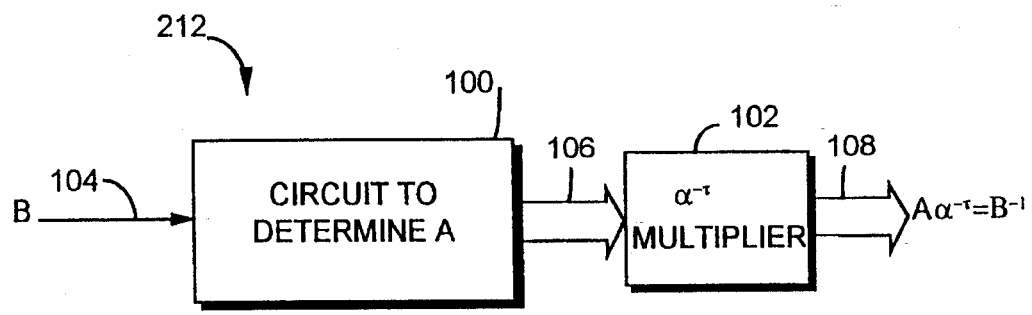
FIG. 4 is a schematic block diagram of a basic inversion circuit according to the invention.

In view of the mathematical derivations provided above, it should be understood that the inverse of m-bit symbol B (i.e., $B^{-1}$) is equal to the product $A\alpha^{-t}$. FIG. 4 is a generalized block diagram showing inversion circuitry 212 for generating electrical signals corresponding to the value of $B^{-1}$. Consistently with the derivation, the circuitry of FIG. 4 shows a circuit 100 (which determines an m-bit value for A) and an $\alpha^{-t}$ multiplier 102. Input values of bits $B_k$ forming B are serially applied to circuit 100 on input line 104 during the first m clocks. After 2m−2 clocks, the value A (in first or canonical basis representation) is applied on m-bit parallel bus 106 to $\alpha^{-t}$ multiplier 102. An m-bit output bus 108 carries electrical signals indicative of $B^{-1}$ (the product $A\alpha^{-t}$).

Figure 4A:
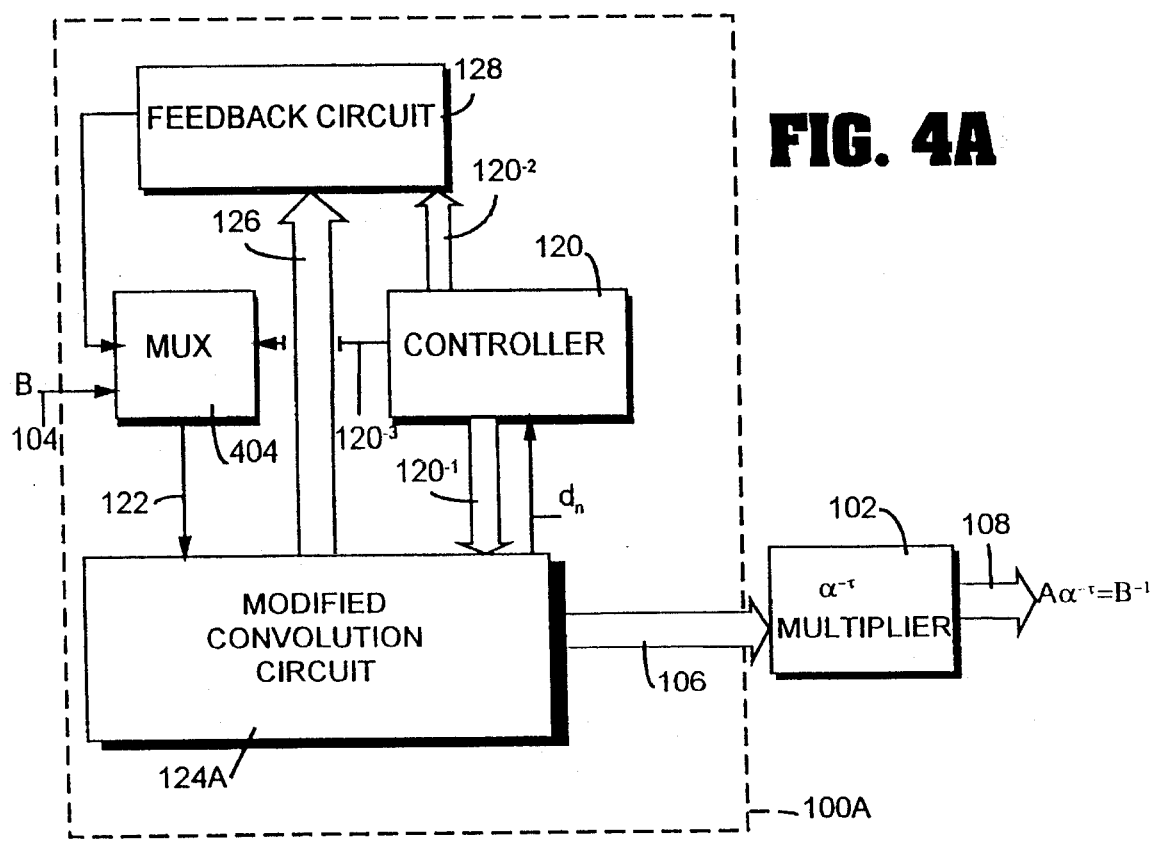
FIG. 4A is a schematic block diagram depicting a first embodiment of the inversion circuit of FIG. 4.

As explained in more detail below, circuit 100 for determining electrical signals corresponding to the value of A can take various forms. For example, FIG. 4A shows a circuit 100A for determining electrical signals corresponding to the value of A and which is driven by controller 120. As shown generally in FIG. 4A, circuit 100A particularly includes a MUX 404 having a first output pin connected by serial line 122 to a modified binary-oriented Berlekamp-Massey circuit 124A (also known as a modified convolution Circuit). Modified Berlekamp-Massey circuit 124A is connected by an m-bit feedback bus 126 to feedback circuit 128 and by bus 106 to $\alpha^{-t}$ multiplier 102. An output of feedback Circuit 128 is serially applied to a second input of MUX 404, the first input of MUX 404 being connected to receive the input values of bits $B_k$. Controller 120 applies clocking and control signals on lines 120-1 to modified Berlekamp-Massey circuit 124A and on lines 120-2 to feedback circuit 128, and a select signal on line 120-3 to MUX 404. Controller 120 receives a signal $d_n$ from circuit 124A.

Figure 4B:
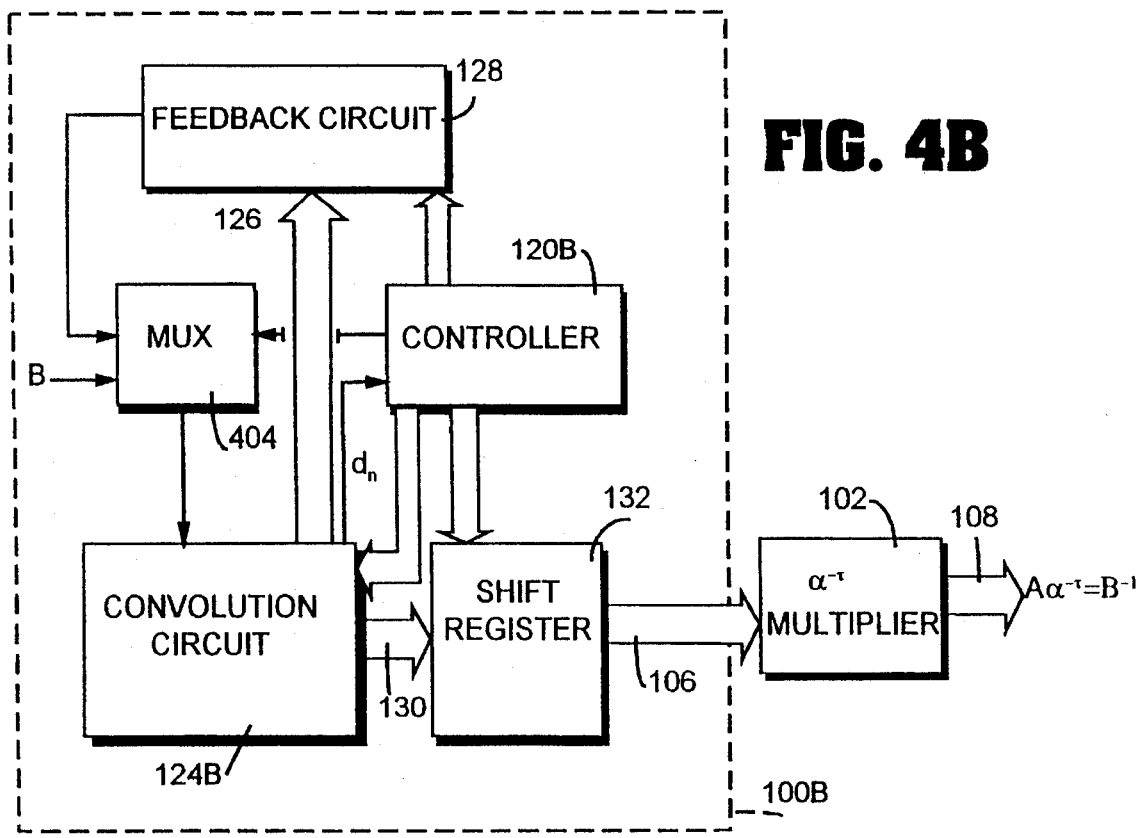
FIG. 4B is a schematic block diagram depicting a second embodiment of the inversion circuit of FIG. 4.

A second embodiment of circuitry for determining electrical signals corresponding to the value of A is shown as circuit 100B in FIG. 4B. Circuit 100B of FIG. 4B primarily differs from circuit 100A of FIG. 4A in that modified binary-oriented Berlekamp-Massey circuit 124 of FIG. 4A is replaced by the combination of a more conventional binary-oriented Berlekamp-Massey-type circuit 124B and a shift register 132. Certain registers of Berlekamp-Massey-type circuit 124B (in particular "A" registers corresponding to those often known as σ registers) are connected by m-bit bus 130 to the m input pins of shift register 132. Output pins of shift register 132 are connected by m-bit bus 106 to $\alpha^{-t}$ multiplier 102.

Figure 4C:
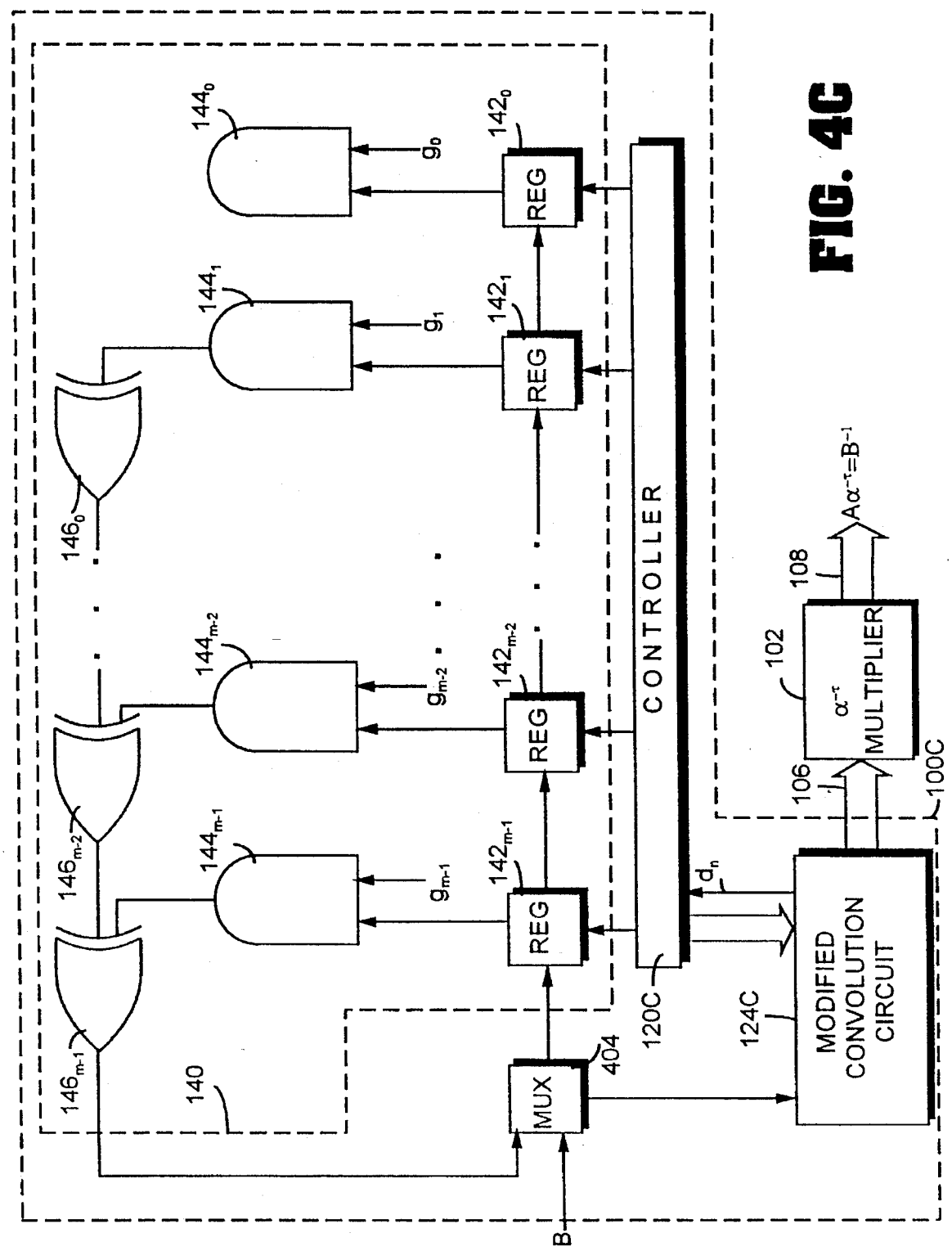
FIG. 4C is a schematic block diagram depicting a third embodiment of the inversion circuit of FIG. 4.

Yet a third embodiment of circuitry for determining electrical signals corresponding to the value of A is shown as circuit 100C in FIG. 4C. Circuit 100C of FIG. 4C primarily differs from circuit 100A of FIG. 4A in that feedback bus 126 and feedback circuit 128 are replaced with a modified feedback circuit 140. Modified feedback circuit 140 comprises a plurality of registers $142_0$–$142_{m-1}$, with register $142_{m-1}$ being serially fed from MUX 404 simultaneously with the feeding of modified Berlekamp-Massey circuit 124C. Registers $142_0$–$142_{m31\ 1}$ are also serially connected so that values may be shifted rightwardly from register $142_{m-1}$ to register $142_0$ during m clock cycles. The contents of the registers $142_0$–$142_{m-1}$ are also serially connected to, first input pins of respective AND gates $144_0$–$144_{m-1}$. A second input pin of each AND gate 144 is connected either to a "1" or "0" value to produce a feedback circuit in accordance with the particular field generator polynomial. Output pins of the AND gates $144_0$ and $-144_1$ are connected to first and second pins of XOR gate $146_0$. XOR gates $146_1$ through $146_{m-1}$ have first input pins connected to output pins of correspondingly subscripted AND gates 144, and second input pins connected to output pins of the XOR gate 146 having the next lowest subscript value. The output pin of XOR gate $146_{m-1}$ is connected to the second input terminal of MUX 404.

Figure 5:
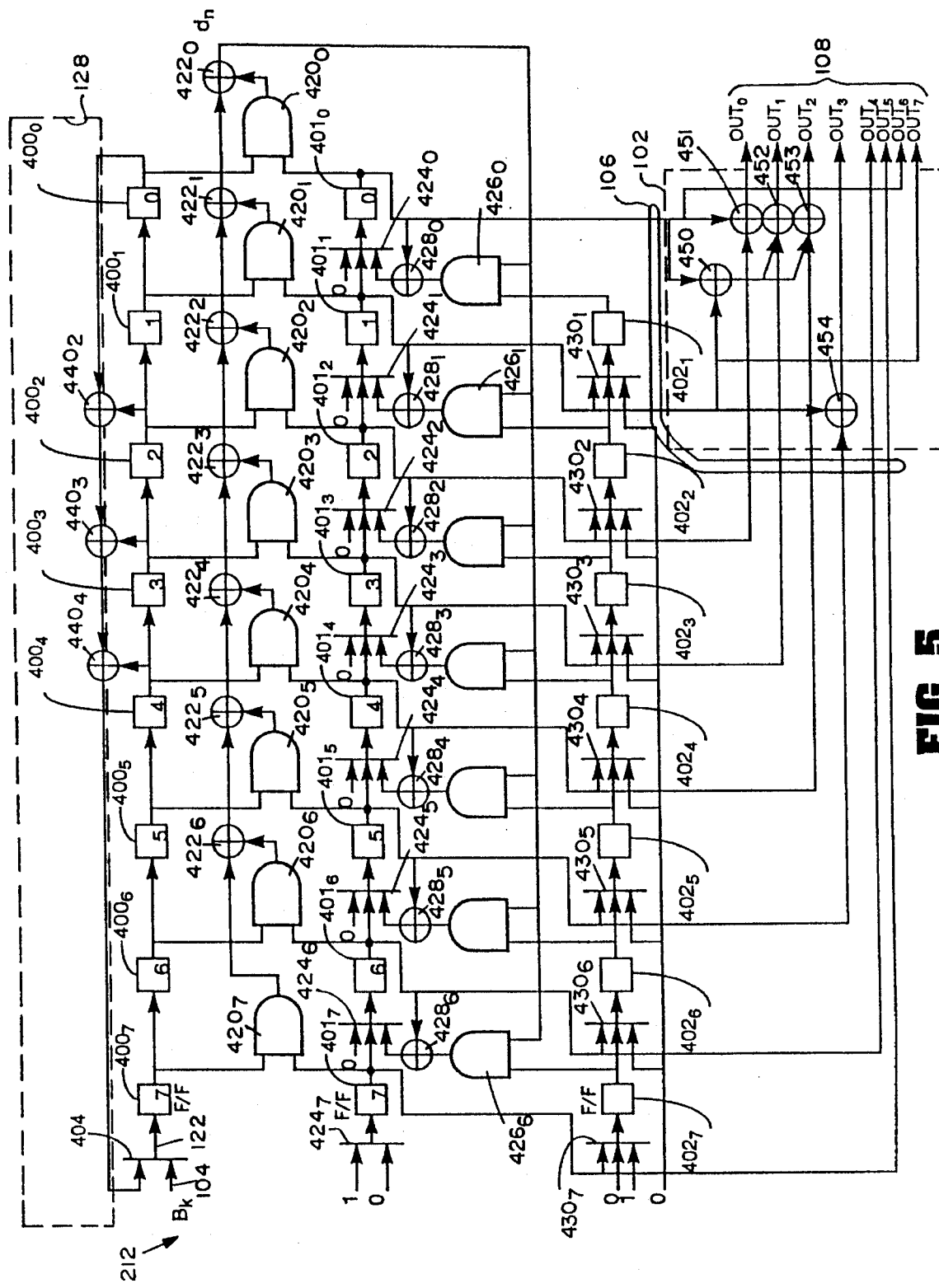
FIG. 5 is a schematic diagram illustrating in detail the first embodiment of FIG. 4A.

FIG. 5 shows details of the inversion circuit 212 of the embodiment of FIG. 4A for implementing an illustrative field generator (e.g., $x^8+x^4+x^3+x^2+1$). Inversion circuit 212 includes MUX 404, feedback circuit 128, and $\alpha^{-t}$ multiplier circuit 102. The remaining elements of FIG. 5 are included in the modified binary-oriented Berlekamp-Massey circuit 124A of FIG. 4A.

The modified Berlekamp-Massey circuit 124A of FIG. 5 includes a bank of "B" registers $400_0$–$400_7$; a bank of "A" registers $401_0$–$401_7$; and a bank of intermediate registers $402_1$–$402_7$. In view of the binary orientation of circuit 124A, registers 400, 401, and 402 are one bit flip-flops and, accordingly, are also referenced herein as flip-flops. Output pins of flip-flops 400 are connected so that the contents thereof can be rightwardly shifted (e.g., output from flip-flop $400_7$ to flip-flop $400_6$, output from flip-flop $400_6$ to flip-flop $400_5$, and so forth). In similar manner with a conventional Berlekamp-Massey circuit, output pins of paired ones (same number subscript) of the flip-flops 400 and 401 are ANDed together (at AND gates 420). Outputs from the output pins of AND gates 420 are added together by adders $422_0$–$422_6$ (which in GF(2) are XOR gates) to produce a term which is analogous to the current discrepancy $d_n$ (output from adder $422_0$).

Unlike a conventional Berlekamp-Massey circuit, the modified Berlekamp-Massey circuit 124A of FIG. 5 includes three-input MUXes $424_0$–$424_6$ for controlling selection of input into corresponding flip-flops $401_0$–$401_6$, respectively. Each of three-input MUXes $424_0$–$424_6$ includes a first input pin for loading an initializing value ("0"); a second pin for receiving a shifted value from a leftwardly neighboring flip-flop 401; and, a third pin connected in a manner hereinafter described for receiving an updating value derived from the contents of a neighboring intermediates register 402 and the discrepancy term $d_n$. Flip-flop $401_7$ has a two-input MUX $424_7$ which receives either the value "0" or "1".

The modified Berlekamp-Massey circuit 124A of FIG. 5 further includes a plurality of AND gates $426_0$–$426_6$, with each AND gate 426 having its output pin connected to a first input of an associated ADDER 428 (e.g., the output pin of AND gate $426_0$ is connected to the first input pin of ADDER $428_0$, the output pin of AND gate $426_1$ is connected to the first input pin of ADDER $428_1$, and so forth). A second input pin of each AND gate 426 is connected to receive the current discrepancy $d_n$ from ADDER $422_0$. A second input pin of each ADDER 428 is connected to the output pin of its corresponding (like subscripted) flip-flop 401. The output pin of each ADDER 428 is connected to the third input pin of a corresponding (like subscripted) three-input MUX 424 as described above. The second input pin of each AND gate 426 is connected to an output pin of a leftwardly neighboring intermediate flip-flop 402.

A three-input MUX 430 is provided for each intermediate flip-flop 402. MUXes $430_1$–$430_1$ have a first input pin connected to receive the initializing value "0"; MUX $430_7$ has a first and second input pins connected to receive the initializing values "1" and "0", respectively. A second input pin of MUXes $430_1$–$430_6$ is connected to receive the output from a leftwardly neighboring intermediate register 402 (a register 402 with subscript decremented by one). A third input pin of MUXes $430_1$–$430_7$ is connected to receive the output from a like-subscripted A flip-flop 401.

Each A flip-flop 401 has its output pin connected to a rightwardly neighboring flip-flop 401 (via the second input pin of a suitable MUX 424 as above described), to an AND gate 420 (for use in generating the discrepancy $d_n$), to a like-subscripted intermediate flip-flop 402 (via a like subscripted MUX 430), and (via a lead in bus 106) to the $\alpha^{-t}$ multiplier circuit 102.

Thus, the modified Berlekamp-Massey circuit 124A of FIG. 5 includes a bank B400 of B registers (flip-flops) 400; a bank B401 of A registers (flip-flops) 401; and a bank B402 of intermediate registers (flip-flops) 402. As used herein, it should be understood that a flip-flop is a one bit register, and that registers having greater than one bit capacity can be utilized so long as other aspects of the invention are practiced. If the number of flip-flops in banks B400 and B401 are "m" (m=8 in the illustrated embodiment), the number of flip-flops in bank B402 is m–1. Moreover, as illustrated in FIG. 5, at least the m–1 lower order "A" flip-flops 401 have associated three-input MUXes 424, thereby enabling bank B401 to serve as a rightwardly shifting shift register.

In view of the particular field generator polynomial employed in the illustrated example, the feedback circuit 128 of FIG. 5 comprises ADDERS $440_2$, $440_3$, and $440_4$. A first input pin of ADDER $440_2$ is connected to an output pin of flip-flop $400_0$ while a second input pin of ADDER $440_2$ is connected to an output pin of flip-flop $400_2$. A first input pin of ADDER $440_3$ is connected to an output pin of ADDER $440_2$ while a second input pin of ADDER $440_3$ is connected to an output pin of flip-flop $400_3$. Likewise, a first input pin of ADDER $440_4$ is connected to an output pin of ADDER $440_3$ while a second input pin of ADDER $440_4$ is connected to an output pin of flip-flop $400_4$. The output pin of ADDER $440_4$ is connected to a second input of MUX 404, the first input pin of MUX 404 being connected to receive the $B_k$ bit of the m-symbol B to be inverted.

The $\alpha^{-t}$ multiplier circuit 102 of FIG. 5 is configured to multiply the value of A as transmitted on bus 106 by $\alpha^{-2}$. The value of "t" can otherwise be chosen as discussed above in connection with the mathematical derivations. The $\alpha^{-t}$ multiplier circuit 102 of FIG. 5 particularly comprises a plurality of ADDERs 450–454 uniquely connected to provide for multiplication by $\alpha^{-2}$ as will be understood by the man skilled in the art. The output of $\alpha^{-t}$ multiplier circuit 102, supplied on m-bit parallel bus 108, is the value $A\alpha^t = B^{-1}$, which is the desired inverse of m-bit symbol B inputted to inversion circuit 212.

Figure 6:
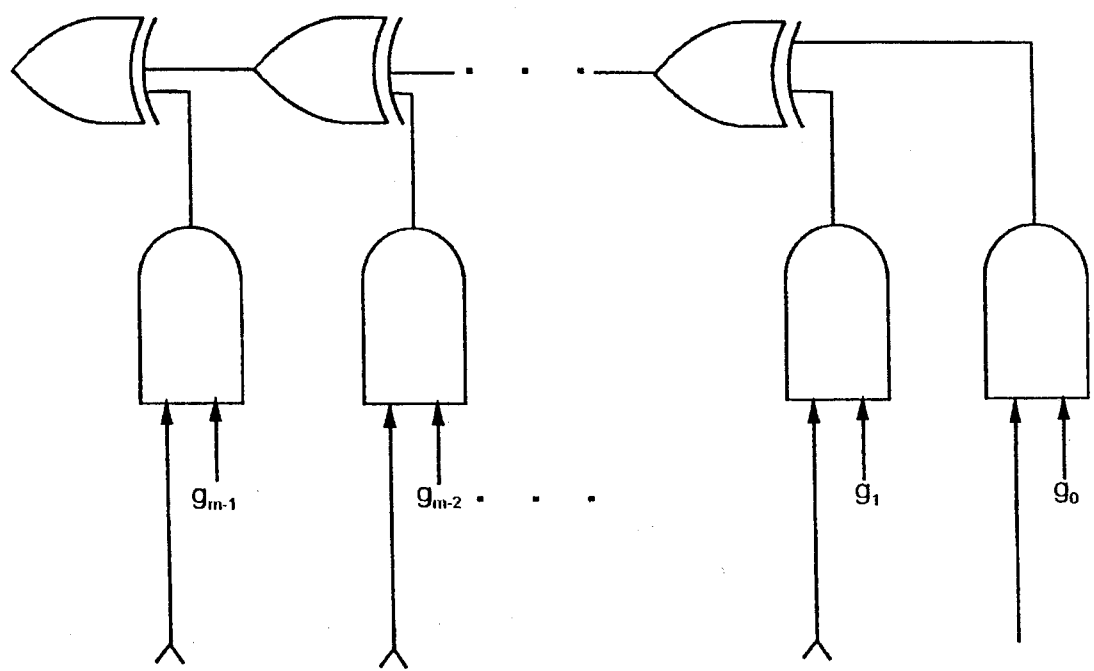
FIG. 6 is a schematic diagram illustrating a modified feedback circuit.

FIG. 6 shows a generic feedback circuit which can be utilized for the circuits 128 of FIG. 4A or FIG. 4B. The structure and operation of the circuit of FIG. 6 is understood with reference to modified feedback circuit 140 of FIG. 4C.

OPERATION

The ultimate output of all embodiments described herein is an m-bit electrical signal which represents the inverse of an m-bit input symbol B (in second or dual basis representation). In particular, in view of the mathematical derivations provided above, the ultimate output signal is $B^{-1} = A\alpha^{-t}$. Electrical signals corresponding to the m-bit value A are generated by circuit 100 (e.g., circuit 100A in FIG. 4A; circuit 100B in FIG. 4B; circuit 100C in FIG. 4C) are output on bus 106 to $\alpha^{-t}$ multiplier circuit 102. The ultimate output from $\alpha^{-t}$ multiplier 102 is obtained on bus 108, and is the product of A and $\alpha^{-t}$, i.e., $B^{-1}$.

The operation of the embodiment depicted in FIG. 4A and FIG. 5 will first be described, from which a understanding will be gained for explanation of the operation of the embodiments of FIG. 4B and 4C.

In operation, the inversion circuit 212 of FIG. 5 is first initialized, after which the bits $B_k$ of m-bit symbol B are clocked into registers 400. During a specific number of clock cycles, inversion circuit 212 performs a convolution operation similar to that of a conventional binary-oriented Berlekamp-Massey circuit (e.g., determining a current discrepancy $d_n$ and updating values in registers 401 and 402). The m-bit value A will ultimately be stored in register 401. The m-bit value of A is developed under the constraint that the inner product of A (in first basis representation) and $\alpha^k B$ (in second basis representation) is zero for $k < m-1$.

As explained above, particularly with reference to EQNs. 6–8, for example, development of A occurs by the convoluted iteration using a sequence $\{S_n\}$. For the m-bit symbol B, the first m members of sequence $\{S_n\}$ (e.g., $S_0$ through $S_{m-1}$) are the first m bits of B (e.g., $B_0$ through $B_{m-1}$). Thus, for the first m clock cycles, the values $B_0$ through $B_{m-1}$ are serially clocked into registers 400. The remainder of the sequence $\{S_n\}$ is generated using feedback circuit 128, which generates a feedback $\alpha$ multiple of B. Generating the remainder of sequence $\{S_n\}$ in this manner is understood from the foregoing definition of sequence $\{S_N\}$, particularly the expression $S_{j+k} = (\alpha^k B)_j$.

Generation of the sequence $\{S_n\}$, and consequentially of the A values in registers 401, continues until either (1) 2m–2 clock cycles are executed, or (2) a length greater than m–1 is attained (provided that $d_n \neq 0$). If a length of greater than m–1 is attained prior to 2m–2 clock cycles, values in the registers (flip-flops) 401 are shifted rightwardly (one flip flop per clock cycle) until cycle 2m–2 is reached. This shifting brings in leading zeros in the left registers 401, thereby essentially right justifying the A value in registers 401.

Describing now the operation of the inversion circuit 212 Of FIG. 5 in more detail, controller 120 keeps track of numerous values, including n and the length "L". Moreover, controller 120 is connected to receive the current discrepancy value $d_n$ (output from adder $422_0$). Controller 120 also sequences and times the operation of the modified Berlekamp-Massey convolution circuit 124A, including application of select signals to MUXes 404, 424, and 430. Controller 120 can be a hardwired Circuit such as a state machine or a programmable computer. In either case, the man skilled in the art will know how to design/program controller 120 such that controller 120 governs the operations and parameters described herein.

Initially, controller 120 sets n=0 and applies select signals to MUXes $424_7$ and $430_7$ so that flip-flops $401_7$ and $402_7$ are initialized at "1". Controller 120 applies select signals to MUXes $424_6$–$424_0$ and MUXes $430_6$–$430_0$ so that flip-flops $401_6$ through $401_0$ and flip-flops $402_6$ through $402_1$ are initialized at "0". Controller 120 also applies a select signal to MUX $404_7$ so that input bits $B_k$ of the m-bit symbol B-to-be-inverted can be clocked into flip-flop $400_7$ from line 104.

After initialization, during the first m clock cycles, bits $B_k$ (constituting members $S_0$–$S_{m-1}$ of sequence $\{S_n\}$) are serially clocked into flip-flops $400_7$–$400_0$. That is, during clock 0, $B_0$ is clocked into flip-flop $400_7$ for a Berlekamp-Massey-type (BK-type) iteration with ultimately involves other members of a "slice" including flip-flop $401_7$ and $402_7$, and which updates values in flip-flop $401_1$ and $402_6$ of the next (e.g., rightwardly neighboring) slice. During clock 1, $B_0$ is shifted into flip-flop $400_6$ and $B_1$ is clocked into flip-flop $400_7$ for a BK-type iteration which involves two slices. The shifting of already-loaded $B_k$S and clocking in of further $B_k$'s continues until flip-flops $401_7$ through $400_0$ are loaded with the bit values $B_7$–$B_0$, respectively.

After the first m clock cycles, controller 120 changes select input to MUX 404 so that an $\alpha$ multiple feedback signal from feedback circuit 128 is applied via MUX 404 to flip-flop $400_7$. Such change of select input to MUX 404 allows for the remainder of sequence $\{S_n\}$ (i.e., $S_k$, k>m–1) to be an $\alpha$ multiple of B. In other words, during iteration m, $S_m = (\alpha^2 B)_{m-1}$ is generated; during iteration m+1, $S_{m+1} 1 (\alpha^2 B)_{m-1}$ is generated; during iteration m+2, $S_{m+2} = (\alpha^2 B)$ is generated; and so forth The foregoing operation of feedback circuit 128 is understood in conjunction with the foregoing derivation of sequence $\{S_n\} = S_{j+k} = (\alpha^k B)_j$. After the $m^{th}$ clock cycle, j is held constant and k is incremented for each succeeding clock.

BK-type iterations continue in the aforedescribed manner until either (1) 2m–2 clock cycles are executed, or (2) a length greater than m–1 is attained (provided that $d_n \neq 0$). If a length of greater than m–1 is attained prior to 2m–2 clock cycles, controller 120 stops the BK-type iterations and, for the remaining 2m–2 clocks, conducts a series of clocked shifts. In particular, controller 120 applies a select signal to MUX $424_1$ so that the value "0" is clocked into flip-flop $401_7$. Controller 120 applies a select signal to MUXes $424_6$–$424_0$ so that values from flip-flops $404_7$–$401_1$ are right-shifted into flip-flops $401_6$–$401_0$, respectively, for each succeeding clocked shift. For each succeeding clocked shift, "0" is loaded into flip-flop $401_7$.

The result of the clocked shifts is the introduction of a proper number of leading zeros and right bit-position Justification of the value A in flip-flops 401. In the case where such right justification occurs (which is not necessarily every case), before the start of the shifting there will be at least as many zeroes in the right-most flip-flops 401 as will be shifted in from the left. Thus, the clocked shifts essentially constitute a zero fill operation.

At the end of 2m–2 clock cycles, inversion circuit 212 of FIG. 5 has the value A (in first basis representation) in flip-flops 401. The one bit values in each of flip-flops 401 are applied (via respective leads in bus 106) to $\alpha^{-t}$ multiplier 102. An 8-bit parallel output of $\alpha^{-t}$ multiplier 102 is available on bus 108 which provides the sought value $B^{-1}$.

Operation of the embodiment of FIG. 4B differs from the embodiment depicted in FIG. 4A and FIG. 5 upon reaching length L≧m (provided that d, is not zero). Rather than performing a zero fill and shifting operation for flip-flops 401, upon the length change exceeding m−1, values in flip-flops 401 are clocked (via parallel bus 130) into 8 bit shift register 132. Then, during the remaining clocks (up to clock 2m−2), zeroes are loaded into the left-most position of shift register 132 and each bit shifted rightwardly (one bit position per clock cycle). At the end of 2m−2 clocks, the m-bit value in shift register 132 is applied (via bus 106) to $\alpha^{-t}$ multiplier 102.

Operation of the embodiment of FIG. 4C differs from the embodiment depicted in FIG. 4A and FIG. 5 primarily in the generation of the sequence $\{S_n\}$, and particularly for generating $S_k$ for k≧m. In particular, for the first m clock cycles, $B_0, \ldots B_7$ are serially loaded into registers 142 in much the same manner and at the same time as being loaded into flip-flops 400. That is, during clock 0, $B_0$ is loaded into both flip-flops $400_7$ and register $142_{m-1}$; during clock 1, $B_0$ is shifted into flip-flop $400_6$ and register $142_{m-2}$ and $B_1$ is loaded into both flip-flop $400_7$ and register $142_{m-1}$ and so forth. Then, after execution of m clocks, the $\alpha$ multiple of B is obtained by multiplying the $\alpha$ feedback values from circuit 140 to the modified Berlekamp-Massey convolution circuit 124C. Thus, in the embodiment of FIG. 4C, the modified Berlekamp-Massey convolution circuit 124C does not include the feedback circuit. Rather, feedback circuit 140 is separately provided.

The execution of controller 120 is further depicted by the following procedure which describes the general case for $GF(p^m)$ where p is not necessarily 2.

---

CONTROLLER PROCEDURE
---

Initialization: n = 0, L = 0, D(x) = 1, E(x) = 1, $d_m = 1$
LOOP $$d_n = \sum_{k=0}^{L} D_k S_{n-k}$$

IF n = 2m−2 THEN
        STOP
    END IF
    IF n−L+1 > m−1 THEN
        D(x) = xD(x)
    ELSE
        temp = D(x)
        D(x) = D(x) − $d_n d_m^{-1}$ xE(x)
        If n−L+1 > L and $d_n$ is not zero THEN
            E(x) = temp
            L = n−L+1
            $d_m = d_n$
        ELSE
            E(x) = xE(x)
        END IF
    END IF
    n = n+1
END LOOP

---

After completion $$\sum_{k=0}^{m-1} D_k S_{2m-2-k} = d_n$$

The last equation of EQNS. 7 requires the above sum to be 1 so D(x) must be divided by $d_n$. Also, the order of the coefficients for D(x) is opposite the ordering of the components of A. Therefore $A_k = D_{m-1-k}/d_n$ for k=0,1, ..., m−1 which is the $\alpha$ representation for $B^{-1}\alpha^t$.

The transformation from the β representation to the β representation is based on EQN.1. In EQN.1, B is set to be $a^j$ for j=0,1, ..., m−1. Evaluating the trace functions yields $(\alpha^j)_k$, i.e. the components of the β0 representations of the first m powers of u which are the a basis set. If $A_k$ are the components of an element in u representation and $B_k$ are the components of the same element in β representation then $$B_k = \sum_{j=0}^{m-1} A_j (\alpha^j)_k$$

The inverse transform can be found from this expression by setting B to $\beta_n$ which has a 1 for the nth component and 0 elsewhere. This yields m equations which can be solved for $A_k$ for k=0,1, ..., m−1, i.e the components of the a representation of $\beta_n$ which are denoted by $(\beta_n)_k$. Having found these for n=0,1, ..., m−1

$$A_k = \sum_{j=0}^{m-1} B_j (\beta_j)_k$$

The circuit shown in FIG. 4A and FIG. 5 is for the 8-bit symbol case, i.e the field is $GF(2^8)$. The field generator polynomial is chosen to be $G(X) = X^8 + X^4 + X^3 + X^2 1$. $\alpha_o$ is chosen to be $\alpha^{-4}$. $\alpha^t$ is calculated to be $\alpha^2$. In the binary case $d_m$ is always 1 and the final $d_n$ is 1 therefore $A_k = D_{m-1-k}$ at algorithm end. Operation of controller 120 is based on two variables: the loop count, n, and the length, L. On the first clock cycle n is set to 0, $B_0$ is shifted into flip flop $400_7$ via MUX 404, flip flops $401_7$ and $402_7$ are 10 set to 1 and the remaining 401 and 402 flip flops are set to 0 via their input MUXes. The process requires 14 more clock cycles. On each clock n is incremented. Also L is changed to n−L+1 if n−L+1>L, n−L+1<8 and d, is not 0. On each clock if L is being changed then flip flops 402 are loaded from flip flops 401 via their input MUXes. If L is not being changed then flip flops 402 are shifted right with 0 shifted into $402_7$. On each clock if n−L+1<8 then the input MUXes to the 401 flip flops are switched so that each 401 flip flop is updated by adding to it the content of the corresponding 402 flip flop ANDed with $d_n$. If n−L+1>7 then flip flops 401 are shifted right with 0 shifted into $401_7$.

After eight clocks B has been shifted into flip flops 400. For the remaining seven clocks MUX 404 is set so that flip flop $400_7$ receives a feedback signal. This is to allow the generation of the remaining elements of the sequence, $S_k$.

After completion the inverse of B, the OUT bits in FIG. 5, is obtained by multiplying the byte in register 401 by $\alpha^{-2}$, as is shown in FIG. 5.

From the foregoing description of structure and operation, it should be understood that the invention encompasses embodiments for mich m≠8 and t≠2, and which have a different field generator. The man skilled in the art will readily understand how to modify the circuits described herein for such other embodiments. For example, in accordance with particular applications, varying the number of bit s in the symbol B necessarily involves varying the number of flip-flops 400, 401, and 402. With the guidance provided herein, the man skilled in the art also knows how to build a suitable feedback circuit (such as circuit 128) for a different field generator polynomial, and a suitable $\alpha^{-t}$ multiplier for a different to While the invention has been particularly shown and described with reference to the preferred embodiments thereof, it will be understood by those skilled in the art that various alterations in form and detail may be made therein without departing from the spirit and scope of the invention.

The embodiments of the invention in which an exclusive property or privilege is claimed are defined as follows:

1. An inversion circuit for determining an inverse of an m-bit symbol B, the symbol B being expressed in a dual basis representation, the circuit comprising:

an iterative convolution circuit to which the symbol B is applied, the convolution circuit generating and storing electrical signals corresponding to an m-bit value A, the value A being in a first basis representation, the electrical signals for the value A being generated by the convolution circuit such that an inner product of A and $\alpha^k B$ is equal to 0 for k<m−1;

a feedback circuit connected to the convolution circuit for enabling the convolution circuit to perform a convolution With a sequence starting with B and extended by taking $\alpha$ multiples of B; and a multiplier circuit connected to the convolution circuit and which generates electrical output signals corresponding to the product of the value A and $\alpha^{-t}$, wherein $\alpha$ is a field element and t is an integer, the electrical output signals from the multiplier representing the inverse of the m-bit symbol B in the first basis representation.

2. The inversion circuit of claim 1, wherein the convolution circuit comprises a memory wherein electrical signals corresponding to the m-bit value A are stored, and wherein the inversion circuit further comprises means for justifying the m-bit value A.

3. The inversion circuit of claim 2, wherein the means for justifying the m-bit value A operates the memory of the convolution circuit as a shift register.

4. The inversion circuit of claim 3, wherein the memory comprises m number of registers, and wherein the means for justifying the m-bit value A includes an associated multiplexer for each of the m number of registers, and wherein for a plurality of registers the associated multiplexer is operative to select between a convolution input and a register-shift input.

5. The inversion circuit of claim 4 wherein, at a predetermined clock cycle in a convolution performed by the convolution circuit, for the plurality of registers the associated multiplexers are operative to switch input to the registers from a convolution input to a register-shift input.

6. The inversion circuit of claim 5, wherein the convolution circuit generates coefficients of a polynomial and a current discrepancy value $d_n$, and wherein the predetermined clock cycle occurs when a length of the polynomial exceeds m−1 and the current discrepancy value $d_n$ is non-zero.

7. The inversion circuit of claim 2, wherein the memory comprises m number of registers, and wherein the means for justifying the m-bit value A is a shift register connected to the registers.

8. The inversion circuit of claim 1, wherein a configuration of the feedback circuit is dependent upon a field generator polynomial.

9. The inversion circuit of claim 1, wherein m=8.

10. A circuit which determines an m-bit value A for an inputted m-bit symbol B, the symbol B being expressed in a dual basis representation, the circuit comprising:

an iterative convolution circuit to which the symbol B is applied, the convolution circuit generating electrical signals corresponding to the m-bit value A, the value A being in a first basis representation, the electrical signals for the value A being generated by the convolution circuit such that an inner product of A and $\alpha^k B$ is equal to 0 for k<m−1;

a feedback circuit connected to the convolution circuit for enabling the convolution circuit to perform a convolution with a sequence starting with B and extended by taking $\alpha$ multiples of B;

means for bit-position justification of the value A generated by the convolution circuit.

11. The circuit of claim 10, wherein the means for bit-position justification of the value A operates a memory of the convolution circuit as a shift register.

12. The circuit of claim 11, wherein the memory comprises m number of registers, and wherein the means for bit-position justification of the value A includes an associated multiplexer for each of the m number of registers, and wherein for a plurality of registers the associated multiplexer is operative to select between a convolution input and a register-shift input.

13. The circuit of claim 12 wherein, at a predetermined clock cycle in a convolution performed by the convolution circuit, for the plurality of registers the associated multiplexers are operative to switch input to the registers from a convolution input to a register-shift input.

14. The circuit of claim 13, wherein the convolution circuit generates coefficients of a polynomial and a current discrepancy value $d_n$, and wherein the predetermined clock cycle occurs when a length of the polynomial exceeds m−1 and the current discrepancy value $d_n$ is non-zero.

15. The circuit of claim 11, wherein the memory comprises m number of registers, and wherein the means for bit-position justification of the value A is a shift register connected to the memory.

16. The circuit of claim 10, further comprising a multiplier circuit which is connected to the convolution circuit and which generates electrical output signals corresponding to the product of the value A and $\alpha^{-t}$, wherein $\alpha$ is a field element and t is an integer, the electrical output signals from the multiplier representing an inverse of the m-bit symbol B in the first basis representation.

17. The circuit of claim 10, wherein a configuration of the feedback circuit is dependent upon a field generator polynomial.

18. The circuit of claim 10, wherein m=8.

19. A circuit which determines an m-bit value A for an inputted m-bit symbol B, the symbol B being expressed in a dual basis representation, the circuit comprising:

an iterative convolution circuit to which the symbol B is applied, the convolution circuit generating and storing in a bank of convolution registers thereof electrical signals corresponding to the m-bit value A, the value A being in a first basis representation, the electrical signals for the value A being generated by the convolution circuit such that an inner product of A and $\alpha^k B$ is equal to 0 for k<m−1;

a feedback circuit connected to the convolution circuit for enabling the convolution circuit to perform a convolution with a sequence starting with B and extended by taking $\alpha$ multiples of B;

conversion means for converting the bank of convolution registers of the convolution circuit into a shift register.

20. The circuit of claim 19, wherein the memory comprises m number of registers, and wherein the conversion means includes an associated multiplexer for a plurality of registers included in the bank, and wherein for the plurality of registers the associated multiplexer is operative to select between a convolution input and a register-shift input.

21. The circuit of claim 20 wherein, at a predetermined clock cycle in a convolution performed by the convolution circuit, for the plurality of registers the associated multiplexers are operative to switch input to the registers from a convolution input to a register-shift input.

22. The circuit of claim 21, wherein the convolution circuit generates coefficients of a polynomial and a current discrepancy value $d_n$, and wherein the predetermined clock cycle occurs when a length of the polynomial exceeds m−1 and the current discrepancy value $d_n$ is non-zero.

23. A method for determining an inverse of an m-bit symbol B, the symbol B being expressed in a dual basis representation, the method comprising:

applying electrical signals corresponding to bits of the symbol B to an iterative convolution circuit;

conducting iterations of the convolution circuit to generate electrical signals corresponding to an m-bit value A, the value A being in a first basis representation, the electrical signals for the value A being generated by the convolution circuit such that an inner product of A and $\alpha^k B$ is equal to 0 for k<m−1, iterations greater than m number of iterations being conducted with an $\alpha$ multiple of B;

storing electrical signals corresponding to the m-bit value A in a memory; and generating electrical output signals corresponding to a product of the value A and $\alpha^{-t}$, wherein $\alpha$ is a field element and t is an integer, the electrical output signals representing the inverse of the m-bit symbol B in the first basis representation.

24. The method of claim 23, further comprising justifying the m-bit value A in the memory.

25. The method of claim 24, wherein the memory forms part of the convolution circuit, and wherein the step of justifying the m-bit value A comprises shifting bits of the value A in the memory of the convolution circuit.

26. The method of claim 25, wherein the memory comprises a plurality of registers, and wherein the method further comprises multiplexing one of a plurality of inputs into the plurality of registers, the plurality of inputs including a convolution input and a register-shift input.

27. The method of claim 26 wherein, at a predetermined clock cycle in a convolution performed by the convolution circuit, the register-shift input is multiplexed into the plurality of registers.

28. The method of claim 27, wherein the convolution circuit generates coefficients of a polynomial and a current discrepancy value $d_n$, and wherein the predetermined clock cycle occurs when a length of the polynomial exceeds m−1 and the current discrepancy value $d_n$ is non-zero.

29. The method of claim 24, wherein the step of justifying the m-bit value A involves loading the m-bit value into a shift register connected to the memory.

30. The method of claim 23, wherein m=8.

31. The method of claim 23, wherein the electrical signals corresponding to bits of the symbol B are serially applied to the iterative convolution circuit.

32. A method for determining an m-bit value A for an inputted m-bit symbol B, the symbol B being expressed in a dual basis representation, the method comprising:

applying electrical signals corresponding to bits of the symbol B to an iterative convolution circuit;

conducting iterations of the convolution circuit to generate electrical signals corresponding to an m-bit value A, the value A being in a first basis representation, the electrical signals for the value A being generated by the convolution circuit such that an inner product of A and $\alpha^k B$ is equal to 0 for k<m−1, iterations greater than m number of iterations being conducted with an $\alpha$ multiple of B;

storing electrical signals corresponding to the m-bit value A in a memory; and bit-position justifying the value A generated by the convolution circuit.

33. The method of claim 32, wherein the memory forms part of the convolution circuit, and wherein the step of justifying the m-bit value A comprises shifting bits of the value A in the memory of the convolution circuit.

34. The method of claim 33, wherein the memory comprises a plurality of registers, and wherein the method further comprises multiplexing one of a plurality of inputs into the plurality of registers, the plurality of inputs including a convolution input and a register-shift input.

35. The method of claim 34 wherein, at a predetermined clock cycle in a convolution performed by the convolution circuit, the register-shift input is multiplexed into the plurality of registers.

36. The method of claim 35, wherein the convolution circuit generates coefficients of a polynomial and a current discrepancy value $d_n$, and wherein the predetermined clock cycle occurs when a length of the polynomial exceeds m−1 and the current discrepancy value $d_n$ is non-zero.

37. The method of claim 32, wherein the step of justifying the m-bit value A involves loading the m-bit value into a shift register connected to the memory.

38. The method of claim 32, wherein m=8.

39. The method of claim 32, wherein the electrical signals corresponding to bits of the symbol B are serially applied to the iterative convolution circuit.

* * * * *